US009477409B2

(12) United States Patent
Ramanujan et al.

(10) Patent No.: US 9,477,409 B2
(45) Date of Patent: Oct. 25, 2016

(54) ACCELERATING BOOT TIME ZEROING OF MEMORY BASED ON NON-VOLATILE MEMORY (NVM) TECHNOLOGY

(71) Applicant: Intel Corporation, Santa Clara, CA (US)

(72) Inventors: Raj K. Ramanujan, Federal Way, WA (US); Rajesh M. Sankaran, Portland, OR (US); Murugasamy K. Nachimuthu, Beaverton, OR (US); Richard P. Mangold, Forest Grove, OR (US)

(73) Assignee: Intel Corporation, Santa Clara, CA (US)

(*) Notice: Subject to any disclaimer, the term of this patent is extended or adjusted under 35 U.S.C. 154(b) by 103 days.

(21) Appl. No.: 14/318,573

(22) Filed: Jun. 27, 2014

(65) Prior Publication Data
US 2015/0378615 A1   Dec. 31, 2015

(51) Int. Cl.
*G06F 3/06*   (2006.01)
*G11C 7/20*   (2006.01)

(52) U.S. Cl.
CPC ........... *G06F 3/0611* (2013.01); *G06F 3/0625* (2013.01); *G06F 3/0632* (2013.01); *G06F 3/0679* (2013.01); *G11C 7/20* (2013.01)

(58) Field of Classification Search
CPC .. G06F 3/0611; G06F 3/0625; G06F 3/0632; G06F 3/0679; G11C 7/20
See application file for complete search history.

(56) References Cited

U.S. PATENT DOCUMENTS

| 6,195,749 B1 | 2/2001 | Gulick |
| 6,591,376 B1* | 7/2003 | VanRooven et al. ............. G06F 11/1417 713/2 |
| 2004/0010681 A1 | 1/2004 | Lee |
| 2007/0079055 A1 | 4/2007 | Chandramouli et al. |

OTHER PUBLICATIONS

International Search Report and Written Opinion received for International Patent Application No. PCT/US2015/033524, mailed on Aug. 21, 2015, 9 pages.

* cited by examiner

*Primary Examiner* — Yong Choe
(74) *Attorney, Agent, or Firm* — Alpine Technology Law Group LLC

(57) ABSTRACT

Methods and apparatus to accelerate boot time zeroing of memory based on Non-Volatile Memory (NVM) technology are described. In an embodiment, a storage device stores a boot version number corresponding to a portion of a non-volatile memory. A memory controller logic causes an update of the stored boot version number in response to each subsequent boot event. The memory controller logic returns a zero in response to a read operation directed at the portion of the non-volatile memory and a mismatch between the stored boot version number and a current boot version number. Other embodiments are also disclosed and claimed.

23 Claims, 7 Drawing Sheets

ACCELERATING BOOT TIME ZEROING OF MEMORY BASED ON NON-VOLATILE MEMORY (NVM) TECHNOLOGY

FIELD

The present disclosure generally relates to the field of electronics. More particularly, some embodiments generally relate to accelerating boot time zeroing of memory based on Non-Volatile Memory (NVM) technology.

BACKGROUND

Generally, memory used to store data in a computing system can be volatile (to store volatile information) or non-volatile (to store persistent information). Volatile data structures stored in volatile memory are generally used for temporary or intermediate information that is required to support the functionality of a program during the run-time of the program. On the other hand, persistent data structures stored in non-volatile memory are available beyond the run-time of a program and can be reused. Moreover, new data is typically generated as volatile data first, before the user or programmer decides to make the data persistent. For example, programmers or users may cause mapping (i.e., instantiating) of volatile structures in volatile main memory that is directly accessible by a processor. Persistent data structures, on the other hand, are instantiated on non-volatile storage devices like rotating disks attached to Input/Output (I/O or IO) buses or non-volatile memory based devices like flash memory.

As computing capabilities are enhanced in processors, one concern is the speed at which memory may be accessed by a processor. For example, to process data, a processor may need to first fetch data from a memory. After completion of the data processing, the results may need to be stored in the memory. Therefore, the memory access speed can have a direct effect on overall system performance.

Another important consideration is power consumption. For example, in mobile computing devices that rely on battery power, it is very important to reduce power consumption to allow for the device to operate while mobile. Power consumption is also important for non-mobile computing devices as excess power consumption may increase costs (e.g., due to additional power usage, increased cooling requirements, etc.), shorten component life, limit locations at which a device may be used, etc.

Hard disk drives provide a relatively low-cost storage solution and are used in many computing devices to provide non-volatile storage. Disk drives however use a lot of power when compared to solid state drives (including non-volatile memory such as flash memory) since a disk drive needs to spin its disks at a relatively high speed and move disk heads relative to the spinning disks to read/write data. This physical movement generates heat and increases power consumption. Also, flash drives are much faster when performing read and write operations when compared with hard drives. To this end, many computing segments are migrating towards flash memory devices that are non-volatile.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

Figure 1:
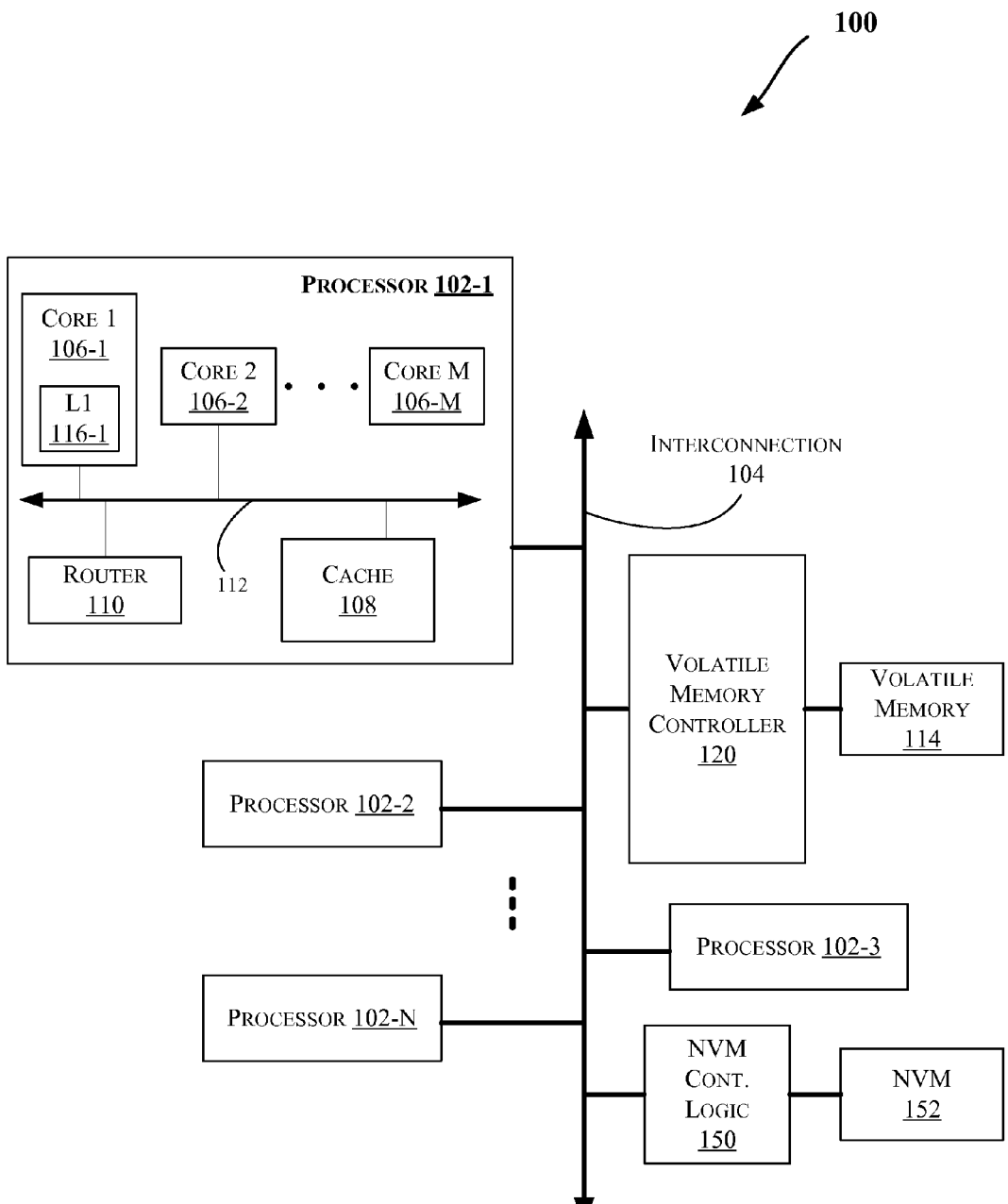
FIGS. 1, 2, 5, 6, and 7 illustrate block diagrams of embodiments of computing systems, which may be utilized to implement various embodiments discussed herein.

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

As discussed above, many computing segments are replacing volatile with Non-Volatile Memory (NVM). Generally, software applications require volatile memory to be zeroed prior to allocation by the OS (Operating System). As the memory footprint of application grows, the time to initialize the memory grows as well. Typically, the OS initializes memory pages in the background and keeps a pool of these available for allocation. However, this is not the case following a boot (e.g., applying power to the system) as all of memory is in uninitialized state. The time to zero out sufficient memory to start applications following a boot is growing rapidly as memory capacity and application demand has been increasing. This problem becomes especially acute when using certain high-speed NVM technology such as PCM (Phase Change Memory) instead of DRAM (Dynamic Random Access Memory) as main memory. The capacities using this technology can be very large but the write bandwidth is significantly slower than DRAM. Given this, boot time initialization could take in the order of several minutes and become a big issue in large systems.

To this end, some embodiments provide instant initialization of NVM based system memory. This in turn allows for very large memory capacities to be supported in computing systems. Various types of NVM may be utilized in various embodiments including NAND flash memory, NOR flash memory, etc. Such embodiments are aimed at avoiding the costly write transactions to the NVM during boot time zeroing. Instead of actually zeroing out memory, an embodiment uses a boot "Version Number" for all of NVM memory and stored along with each portion of this memory that is the size of any read or write operations performed by the processor (e.g., 256B line in NVM). On every boot (e.g., in response to each subsequent boot event), this Boot Version Number is updated (e.g., incremented) and any write transactions/operations to a given portion/line in the NVM will update its Version Number. On a read operation, mismatch between stored Version Number in the line and the current Boot Version Number will cause the memory controller logic to return a zero for data. Hence, actual zeroing operations may be avoided, which significantly improves performance. This technique is sometimes referred to herein as "fast zero" technique or functionality.

By contrast, some implementations for boot time memory zeroing may use brute force writing of zeroes to a large address range before applications are launched. Another approach may perform zeroing at a page level granularity on a demand basis. Both these approaches, however, depend on actually writing to the NVM before handing the zeroed memory to the application. Both approaches will have a significantly long application launch time following a boot as the memory capacity increases with NVM.

Moreover, the techniques discussed herein may be provided in various computing systems (e.g., including a solid state drive and/or a mobile device such as a smartphone, tablet, UMPC (Ultra-Mobile Personal Computer), laptop computer, Ultrabook™ computing device, smart watch, smart glasses, etc.), such as those discussed with reference to FIGS. 1-7. More particularly, FIG. 1 illustrates a block diagram of a computing system 100, according to an embodiment. The system 100 includes one or more processors 102-1 through 102-N (generally referred to herein as "processors 102" or "processor 102"). The processors 102 may communicate via an interconnection or bus 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), logic 120, logic 150, memory controllers (such as those discussed with reference to FIGS. 5-7), NVM (Non-Volatile Memory) 152 (e.g., including flash memory, an SSD (with NAND memory cells)), etc., or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that are utilized by one or more components of the processor 102-1, such as the cores 106. For example, the cache 108 may locally cache data stored in a volatile memory 114 for faster access by the components of the processor 102. As shown in FIG. 1, the memory 114 may be in communication with the processors 102 via the interconnection 104. In an embodiment, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 1, memory 114 may be coupled to other components of system 100 through a volatile memory controller 120. System 100 also includes NVM memory controller logic 150 to couple NVM memory 152 to various components of the system 100. Memory 152 includes non-volatile memory such as nanowire memory, Ferro-electric transistor random access memory (FeTRAM), magnetoresistive random access memory (MRAM), flash memory, Spin Torque Transfer Random Access Memory (STTRAM), Resistive Random Access Memory, 3D Cross Point Memory such as PCM (Phase Change Memory), an SSD with NAND/NOR memory, etc. in some embodiments. Even though the memory controller 150 is shown to be coupled between the interconnection 104 and the memory 152, the logic 150 may be located elsewhere in system 100. For example, logic 150 (or portions of it) may be provided within one of the processors 102, controller 120, etc. in various embodiments. In an embodiment, logic 150 and NVM 152 are included in an SSD. Moreover, logic 150 controls access to one or more NVM devices 152 (e.g., where the one or more NVM devices are provided on the same integrated circuit die in some embodiments), as discussed herein with respect to various embodiments.

As discussed above, some implementations for boot time memory zeroing may use brute force writing of zeroes to a large address range before applications are launched. Another approach may perform zeroing at a page level granularity on a demand basis. Both these approaches, however, depend on actually writing to the NVM before handing the zeroed memory to the application. Both approaches will have a significantly long application launch time following a boot as the memory capacity increases with NVM.

To this end, some embodiments provide instant initialization of NVM based system memory; thus, allowing very large memory capacities to be supported in computing systems. Such embodiments are aimed at avoiding the costly write transactions to the NVM during boot time zeroing. Instead, an embodiment uses a boot "Version Number" for each portion of the NVM that is the size of any read or write operation performed by the processor (e.g., 256B line in NVM). On every boot (e.g., in response to each subsequent boot event), this Boot Version Number is updated (e.g., incremented) and any write transactions/operations to a given portion/line in the NVM will update its Version Number. On a read operation, mismatch between stored Version Number in the line and the current Boot Version Number will cause the memory controller logic to return a zero for data. Hence, actual zeroing transactions may be avoided, which significantly improves performance.

Accordingly, very large memory capacities may be utilized without the penalty of slow boot times. One issue with incrementing or otherwise updating a Version Number on every boot, is that eventually a Version Number will be re-cycled. This condition is referred to as "roll-over". To avoid incorrect zeroing, a roll-over can only happen when it can be guaranteed that the Version Number being re-cycled is not currently stored in any of the NVM lines. One way to ensure this is to write to the entire NVM with an unused Version Number, every time a roll-over occurs. This is a very costly operation. A very large Version Number would make this roll-over condition unlikely but will also add to the cost of storing the number in the NVM. A small Version Number may be used in such a way that a roll-over condition is a (e.g., exceptionally) rare event as further discussed below.

Figure 2:
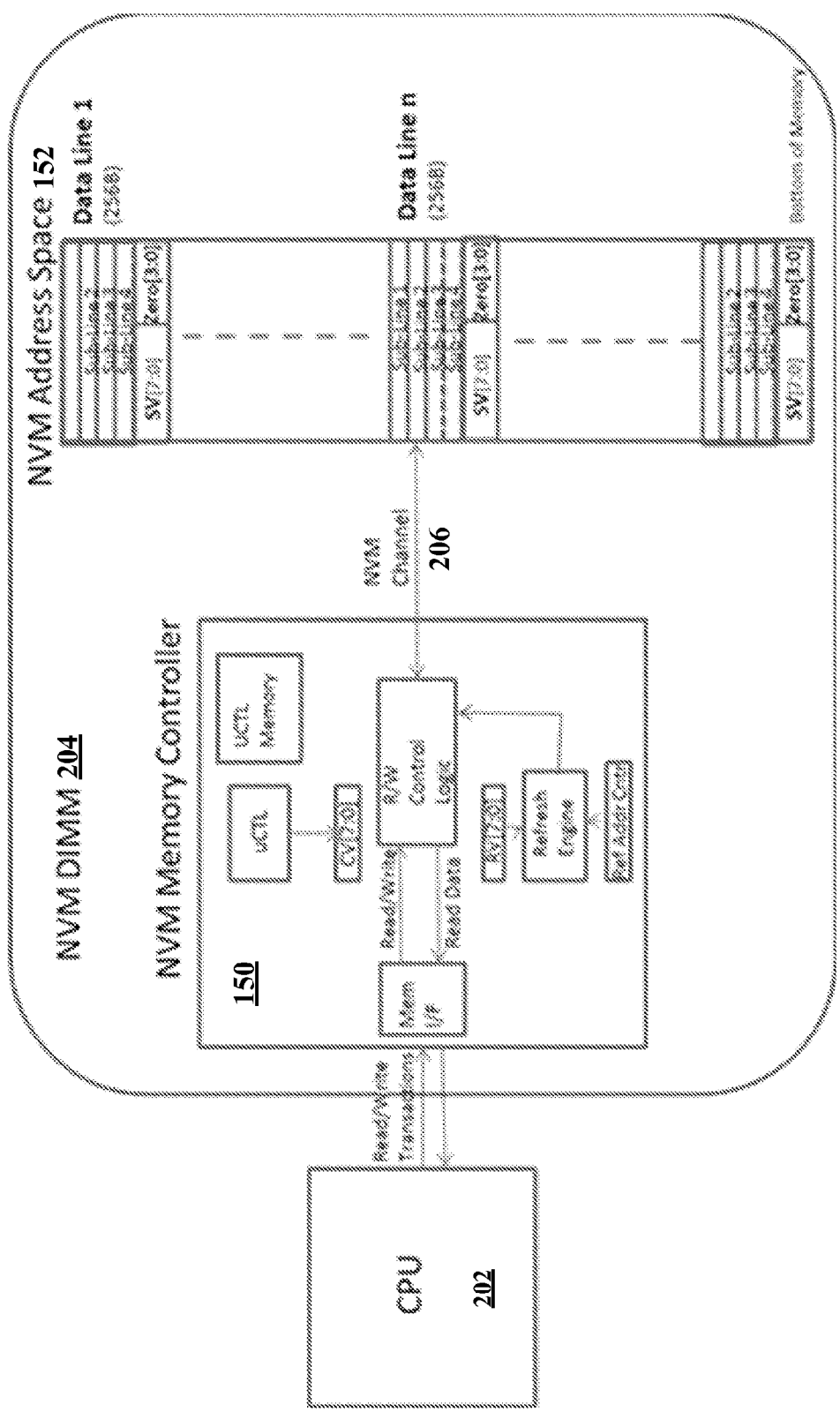

FIG. 2 illustrates a block diagram of a portion of a computing system, according to an embodiment. Central Processing Unit (CPU) 202 may be the same or similar to the processors discussed with reference to FIGS. 1 and 5-7. CPU 202 is coupled an NVM Dual In-line Memory Module (DIMM) 204. The DIMM 204 in turn includes the NVM memory controller logic 150 and NVM 152 (illustrated as memory address space in FIG. 2). Logic 150 and NVM 152 are coupled by an NVM channel 206.

As illustrated in FIG. 2, the NVM controller logic 150 includes a memory interface (I/F) to communicate read/write transactions with the CPU 202. The read/write commands and data are transmitted to a read/write (R/W) control logic to communicate with the NVM 152 via the NVM channel 206 and based on information from a refresh engine logic as further discussed below. The controller logic 150 also includes a micro controller (uCTL) and memory (uCTL memory) to store data as further discussed herein.

Moreover, in the block diagram of FIG. 2, the NVM 152 is used as memory implemented on a DIMM connected to the CPU via a Memory Interface (I/F), e.g., similar to DDR. The DIMM has the NVM Controller logic 150 that in turn interfaces to the NVM 152 that provides the system memory address range to OS and application software.

The NVM controller logic 150 maintains a Boot Version Number labeled CV (for "Current Version"). The CV is incremented following every reboot/boot from the last CV saved in the NVM (e.g., in uCTL memory or another memory in the NVM DIMM 204) on a power-down. In an embodiment, the CV size is 8 bits. As shown in FIG. 2, the NVM address space is subdivided into "lines". In an embodiment, the data size of the line is 256B. The data portion may be further sub-divided in "sub-lines" depending on the CPU read or write access granularity. In an embodiment, there are four 64B sub-lines per line.

In addition to the data, each line of the NVM address space may also store some metadata. A portion of the metadata is used for the Fast Zero functionality. These elements include: (1) Saved Version number or SV (e.g., 8-bits); and (2) one zero bit per sub-line (four bits in an embodiment).

The NVM Controller logic 150 also has a Refresh Engine logic that continuously scrubs each line in the NVM address space. The Refresh Engine uses a Ref-Addr-Counter (reference address counter) to point to a given line to be scrubbed, Once the line is scrubbed, the counter is updated (e.g., incremented). When the entire address space is scrubbed, a "Refresh Cycle" has completed. The Refresh Engine will then start the next Refresh Cycle. A Refresh Cycle may typically complete in a pre-determined interval assuming it is not interrupted by a power-down event. In one embodiment, the uninterrupted Refresh Cycle duration is two days. The entire NVM address range is scrubbed in this timeframe.

Generally, a "scrub" by the Refresh Engine involves reading a line, making any error corrections, and then writing it back. The Refresh Engine will also have a Refresh Version number or "RV" that may be dedicated for its use alone. In an embodiment, the CV can never equal RV. If a Refresh Cycle is interrupted by a power-down event, the state of the Ref-Addr-Cnt is saved in NVM (e.g., in uCTL memory or another memory in the NVM DIMM 204). On power-up, the state is restored in the NVM Controller and the Refresh Engine resumes the Refresh Cycle where it left off. This is important in order to ensure that no portion of the NVM Address space is skipped due to this interruption.

The CPU 202 issues read or write operations directed at the sub-lines to the NVM Controller logic 150. The NVM Controller 150 in turn uses the CV and the line metadata to determine the action to take.

Table 1 below shows the various scenarios in accordance with some embodiments.

TABLE 1

| Transaction | SV = CV | SV ≠ CV | Sub-Line Zero Bit | Action | Final SV & Zero Bit |
|---|---|---|---|---|---|
| Read Sub-Line | — | X | Don't Care | Return Zero Data to CPU | No Change |
| Read Sub-Line | X | — | 0 | Return actual Data to CPU | No Change |
| Read Sub-Line | X | — | 1 | Return Zero Data to CPU | No Change |
| Write Sub-Line(s) | — | X | Don't Care | Write Data; SV = CV; Clear Zero Bits for sub-lines being written; Set other sub-line Zero Bits | SV = CV; Zero-bit for written sub-lines = 0 |
| Refresh Line | X | — | Don't Care | Write bark data + SV + Zero bits | No Change |
| Refresh | — | X | Don't Care | Write back data; SV = RV; Write back Zero bits | SV = RV; Zero bits stay the same |

Following a reboot, and before any CPU write operation to update the NVM lines, any CPU Read will encounter the case where SV≠CV. The exception to this is a Roll-Over case that will be discussed further below. Given this, CPU reads only "zeroes" from all NVM address space. The incrementing of CV on a reboot is equivalent to instantaneously zeroing the entire memory space.

As the CPU starts to write to the NVM address space, the SV's for the updated lines are modified to CV. Any read following this will read the new data and not the emulated Zero. Additionally, for any lines that are not written following a boot, the Refresh Engine will update the SV=RV; thus, ensuring that all stale version numbers are removed once per Refresh Cycle.

Referring to the Roll-Over case mentioned above, a CV cannot be re-used prior to a complete Refresh Cycle since the last time the CV was used. In order to track this, a table called the CV Refresh State Table or CVRT 300 illustrated in FIG. 3, according to an embodiment. The CVRT 300 may be stored in the NVM (e.g., in uCTL memory or another memory in the NVM DIMM 204). The size of the table is dictated by the size of CV. So, an 8-bit CV will have a 256 entry table and so on. One entry (=RV) is never used in an embodiment. Each entry in the table has the CV Refresh State for a given CV.

Figure 3:
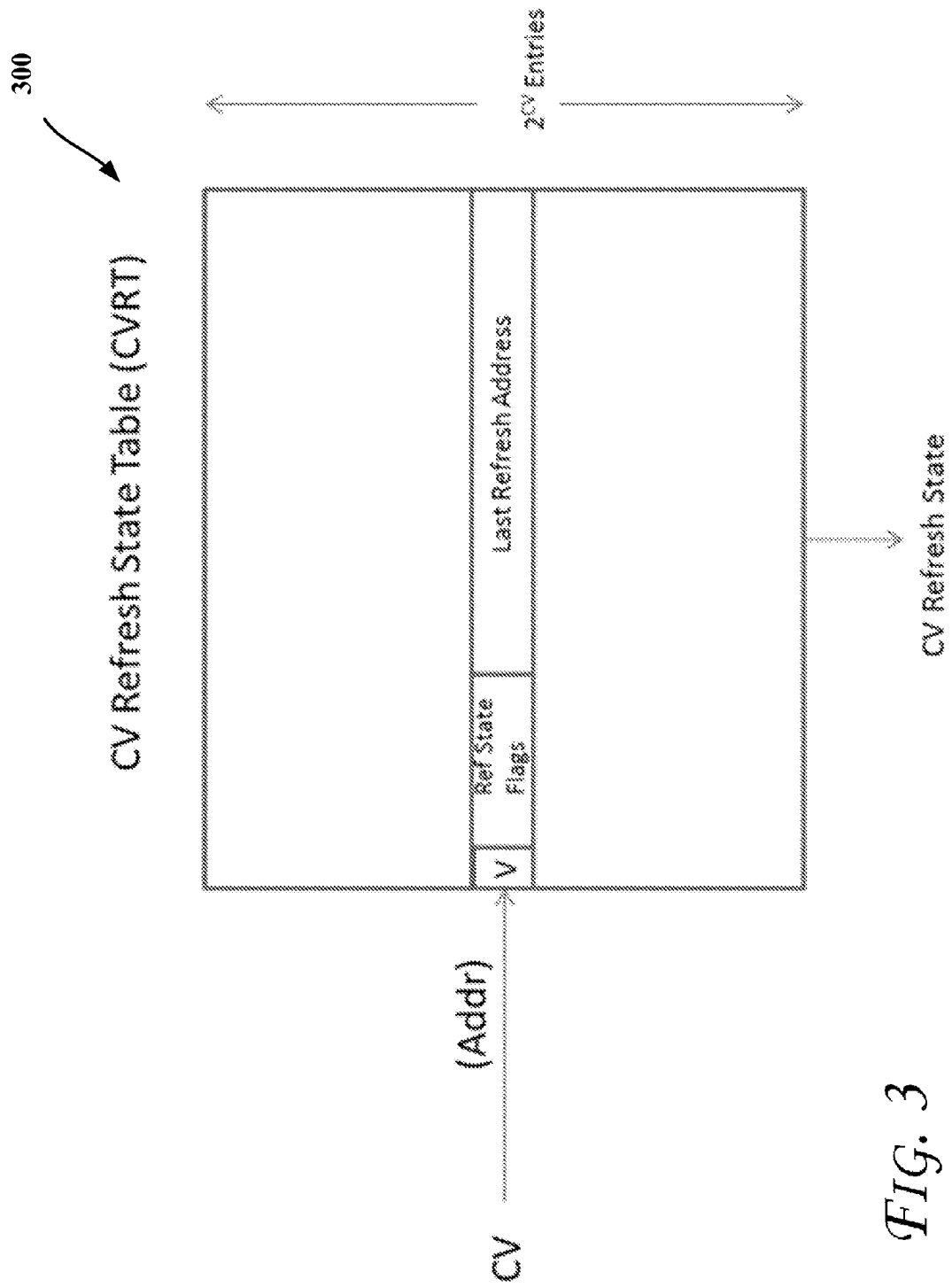
FIG. 3 illustrates a block diagram of a table refresh state table, according to an embodiment.

Referring to FIG. 3, the V bit is set for a CV that has been used at least once. The last Refresh Address is the Ref-Addr-Cnt value when a power-down happened the last time the CV was used. The Ref State Flags are additional bits that allow the determination of whether at least one Refresh Cycle has been completed since the last time the CV was used. One every boot-up sequence when a new CV is generated, the NVM Controller logic 150 checks the CVRT 300 to see if a complete Refresh Cycle occurred since the last time this CV was used. If it has not, a "Roll-Over" condition is said to exist and the Fast Zero mechanism cannot be used to generate zeroes in response to read operations.

There are at least two options to handling the Roll-Over state. One is to have the system software (e.g., including BIOS (Basic Input Output System)) or the NVM Controller logic 150 write the entire NVM Address space with zero data and update the SV=CV at the same time. The other option is to inform the system software (e.g., the OS) that the Fast Zero functionality has not be used for this boot cycle, and that the OS should fall back to its normal approach to zero out pages.

Furthermore, the Roll-Over condition should be a rare exception as long as the CV size is reasonable. For instance, for an 8-bit CV, there would need to be 254 reboots within the normal uninterrupted Refresh Cycle Period in order for a Roll-Over condition to occur. Since a complete Refresh Cycle is likely to be completed within a day or two, such a scenario is likely limited to specific situations like system validation and is unlikely to happen during normal operation. Thus, for all practical purposes, this fast zero mechanism should work every time.

Figure 4:
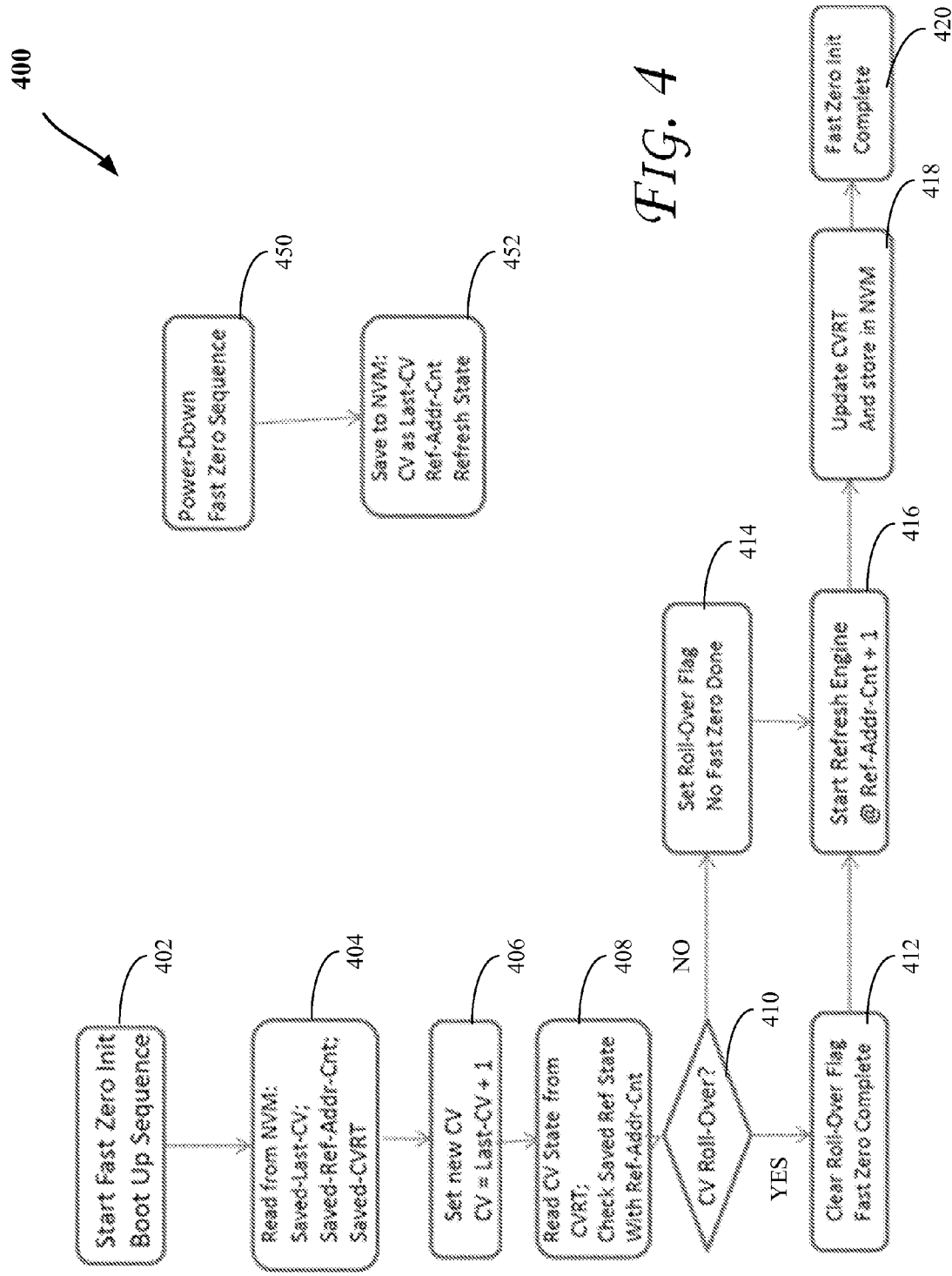
FIG. 4 illustrates a flow diagram of a method to perform boot-up and power-down sequences, in accordance with an embodiment.

FIG. 4 illustrates a flow diagram of a method 400 to perform boot-up and power-down sequences, in accordance with an embodiment. In one embodiment, various components discussed with reference to FIGS. 1-3 and 5-7 may be utilized to perform one or more of the operations discussed with reference to FIG. 4. In an embodiment, one or more operations of method 400 are implemented in logic (e.g., firmware), such as logic 150 of FIG. 1.

Referring to FIGS. 1-4, at an operation 402, the fast zero functionality boot up sequence is initiated. At an operation 404, a read operation from the NVM 152 is detected (which triggers the saving of last CV, ref-addr-cnt, and CVRT 300). At an operation 406, the CV value is updated (e.g., incremented). At an operation 408, the CV state is read from CVRT 300 and the saved reference state is compared against the saved ref-addr-cnt. An operation 410, determines (e.g., based on the comparison of operation 408) whether a CV roll-over condition exists. If so, an operation 412 clears the roll-over flag to indicate fast zero operations are complete and are to proceed; otherwise, an operation 414 sets the roll-over flag to no fast zero functionality. After operations 412 or 414, the refresh engine is started at an updated/incremented ref-addr-cnt (or ref-addr-cnt+1) at operation 416. The CVRT is updated and stored at operation 418. At an operation 420, the fast zero initialization is complete.

At operation 450, the power-down fast zero sequence is initiated. At an operation 452, the CV is saved as last SV, as well as the ref-address-cnt, and refresh state.

Figure 5:
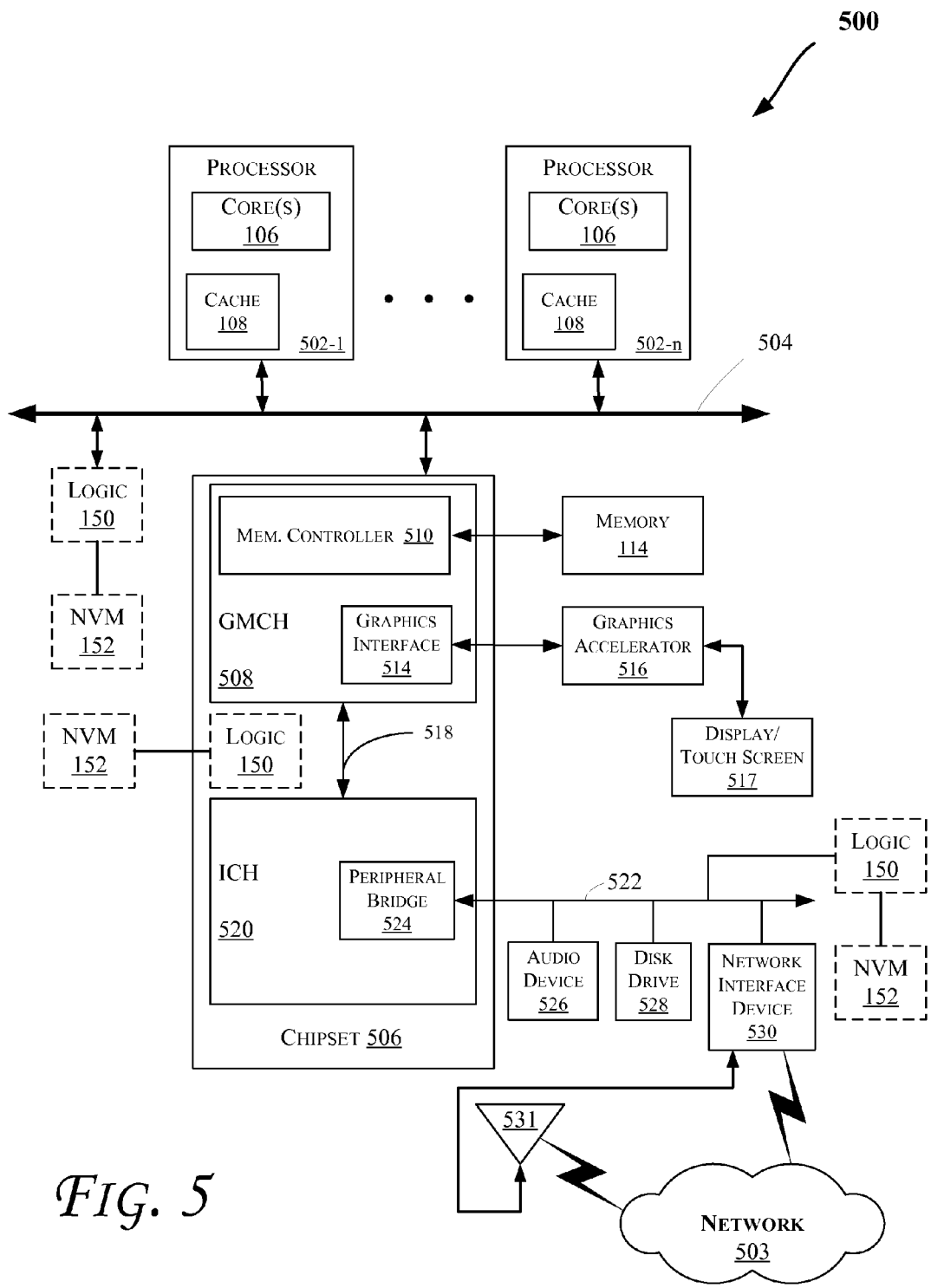

FIG. 5 illustrates a block diagram of a computing system 500 in accordance with an embodiment of the invention. The computing system 500 may include one or more central processing unit(s) (CPUs) 502 or processors that communicate via an interconnection network (or bus) 504. The processors 502 may include a general purpose processor, a network processor (that processes data communicated over a computer network 503), an application processor (such as those used in cell phones, smart phones, etc.), or other types of a processor (including a reduced instruction set computer (RISC) processor or a complex instruction set computer (CISC)). Various types of computer networks 503 may be utilized including wired (e.g., Ethernet, Gigabit, Fiber, etc.) or wireless networks (such as cellular, 3G (Third-Generation Cell-Phone Technology or 3rd Generation Wireless Format (UWCC)), 5G, Low Power Embedded (LPE), etc.). Moreover, the processors 502 may have a single or multiple core design. The processors 502 with a multiple core design may integrate different types of processor cores on the same integrated circuit (IC) die. Also, the processors 502 with a multiple core design may be implemented as symmetrical or asymmetrical multiprocessors.

In an embodiment, one or more of the processors 502 may be the same or similar to the processors 102 of FIG. 1. For example, one or more of the processors 502 may include one or more of the cores 106 and/or cache 108. Also, the operations discussed with reference to FIGS. 1-4 may be performed by one or more components of the system 500.

A chipset 506 may also communicate with the interconnection network 504. The chipset 506 may include a graphics and memory control hub (GMCH) 508. The GMCH 508 may include a memory controller 510 (which may be the same or similar to the memory controller 120 of FIG. 1 in an embodiment) that communicates with the memory 114. System 500 may also include logic 150 (e.g., coupled to NVM 152) in various locations (such as those shown in FIG. 5 but can be in other locations within system 500 (not shown)). The memory 114 may store data, including sequences of instructions that are executed by the CPU 502, or any other device included in the computing system 500. In one embodiment of the invention, the memory 114 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk, flash, 3D Cross Point Memory (such as PCM), Resistive Random Access Memory, NAND memory, NOR memory and STTRAM. Additional devices may communicate via the interconnection network 504, such as multiple CPUs and/or multiple system memories.

The GMCH 508 may also include a graphics interface 514 that communicates with a graphics accelerator 516. In one embodiment of the invention, the graphics interface 514 may communicate with the graphics accelerator 516 via an accelerated graphics port (AGP) or Peripheral Component Interconnect (PCI) (or PCI express (PCIe) interface). In an embodiment of the invention, a display 517 (such as a flat panel display, touch screen, etc.) may communicate with the graphics interface 514 through, for example, a signal converter that translates a digital representation of an image stored in a storage device such as video memory or system memory into display signals that are interpreted and displayed by the display. The display signals produced by the display device may pass through various control devices before being interpreted by and subsequently displayed on the display 517.

A hub interface 518 may allow the GMCH 508 and an input/output control hub (ICH) 520 to communicate. The ICH 520 may provide an interface to I/O devices that communicate with the computing system 500. The ICH 520 may communicate with a bus 522 through a peripheral bridge (or controller) 524, such as a peripheral component interconnect (PCI) bridge, a universal serial bus (USB)

controller, or other types of peripheral bridges or controllers. The bridge 524 may provide a data path between the CPU 502 and peripheral devices. Other types of topologies may be utilized. Also, multiple buses may communicate with the ICH 520, e.g., through multiple bridges or controllers. Moreover, other peripherals in communication with the ICH 520 may include, in various embodiments, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 522 may communicate with an audio device 526, one or more disk drive(s) 528, and a network interface device 530 (which is in communication with the computer network 503, e.g., via a wired or wireless interface). As shown, the network interface device 530 may be coupled to an antenna 531 to wirelessly (e.g., via an Institute of Electrical and Electronics Engineers (IEEE) 802.11 interface (including IEEE 802.11a/b/g/n, etc.), cellular interface, 3G, 5G, LPE, etc.) communicate with the network 503. Other devices may communicate via the bus 522. Also, various components (such as the network interface device 530) may communicate with the GMCH 508 in some embodiments. In addition, the processor 502 and the GMCH 508 may be combined to form a single chip. Furthermore, the graphics accelerator 516 may be included within the GMCH 508 in other embodiments.

Furthermore, the computing system 500 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 528), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 6:
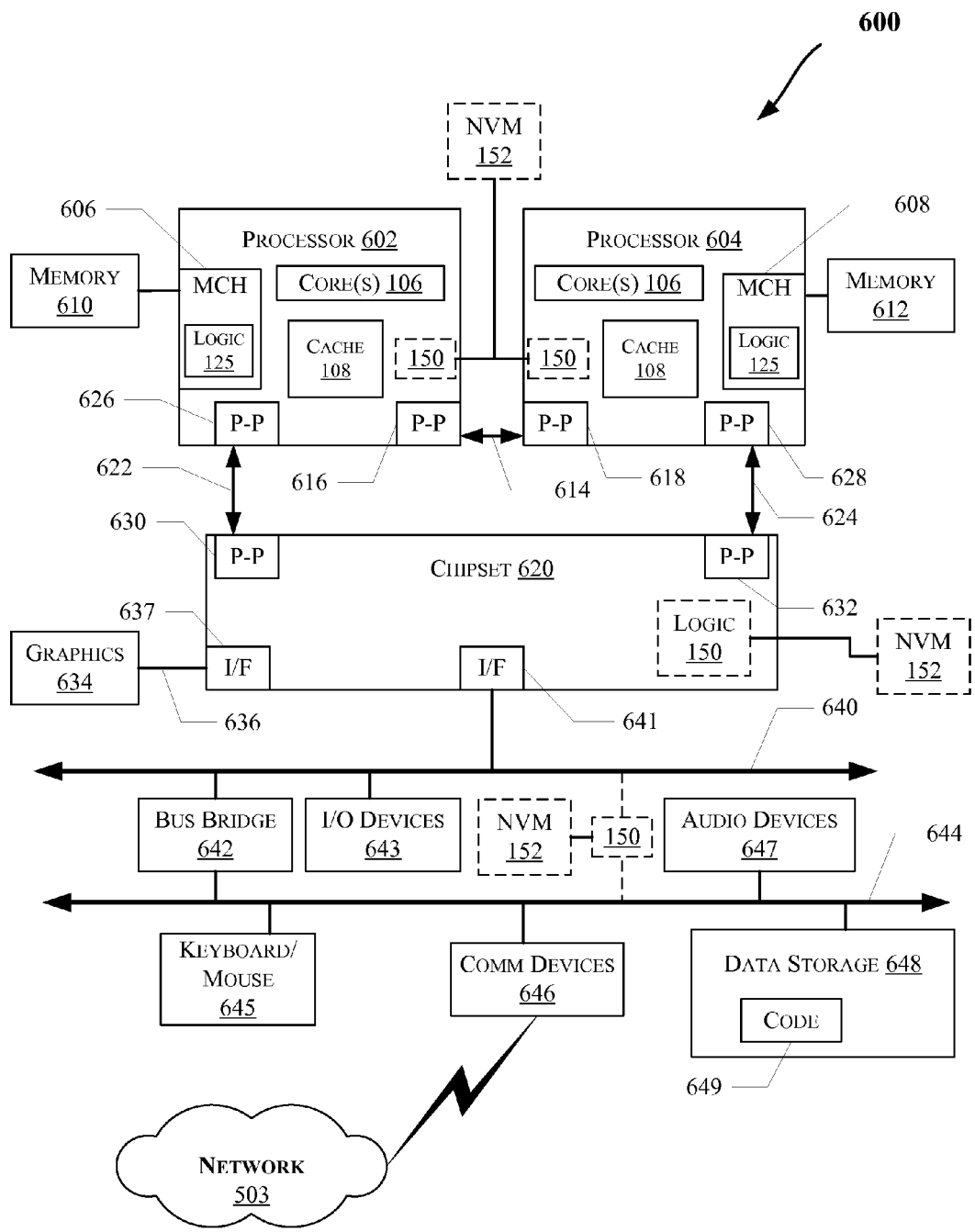

FIG. 6 illustrates a computing system 600 that is arranged in a point-to-point (PtP) configuration, according to an embodiment. In particular, FIG. 6 shows a system where processors, memory, and input/output devices are interconnected by a number of point-to-point interfaces. The operations discussed with reference to FIGS. 1-5 may be performed by one or more components of the system 600.

As illustrated in FIG. 6, the system 600 may include several processors, of which only two, processors 602 and 604 are shown for clarity. The processors 602 and 604 may each include a local memory controller hub (MCH) 606 and 608 to enable communication with memories 610 and 612. The memories 610 and/or 612 may store various data such as those discussed with reference to the memory 114 or NVM 152 of FIGS. 1 and/or 5. Also, MCH 606 and 608 may include the memory controller 120 and/or logic 150 of FIG. 1 in some embodiments.

In an embodiment, the processors 602 and 604 may be one of the processors 502 discussed with reference to FIG. 5. The processors 602 and 604 may exchange data via a point-to-point (PtP) interface 614 using PtP interface circuits 616 and 618, respectively. Also, the processors 602 and 604 may each exchange data with a chipset 620 via individual PtP interfaces 622 and 624 using point-to-point interface circuits 626, 628, 630, and 632. The chipset 620 may further exchange data with a high-performance graphics circuit 634 via a high-performance graphics interface 636, e.g., using a PtP interface circuit 637. As discussed with reference to FIG. 5, the graphics interface 636 may be coupled to a display device (e.g., display 517) in some embodiments.

As shown in FIG. 6, one or more of the cores 106 and/or cache 108 of FIG. 1 may be located within the processors 602 and 604. Other embodiments, however, may exist in other circuits, logic units, or devices within the system 600 of FIG. 6. Furthermore, other embodiments may be distributed throughout several circuits, logic units, or devices illustrated in FIG. 6.

The chipset 620 may communicate with a bus 640 using a PtP interface circuit 641. The bus 640 may have one or more devices that communicate with it, such as a bus bridge 642 and I/O devices 643. Via a bus 644, the bus bridge 642 may communicate with other devices such as a keyboard/mouse 645, communication devices 646 (such as modems, network interface devices, or other communication devices that may communicate with the computer network 503, as discussed with reference to network interface device 530 for example, including via antenna 531), audio I/O device, and/or a data storage device 648. The data storage device 648 may store code 649 that may be executed by the processors 602 and/or 604.

Figure 7:
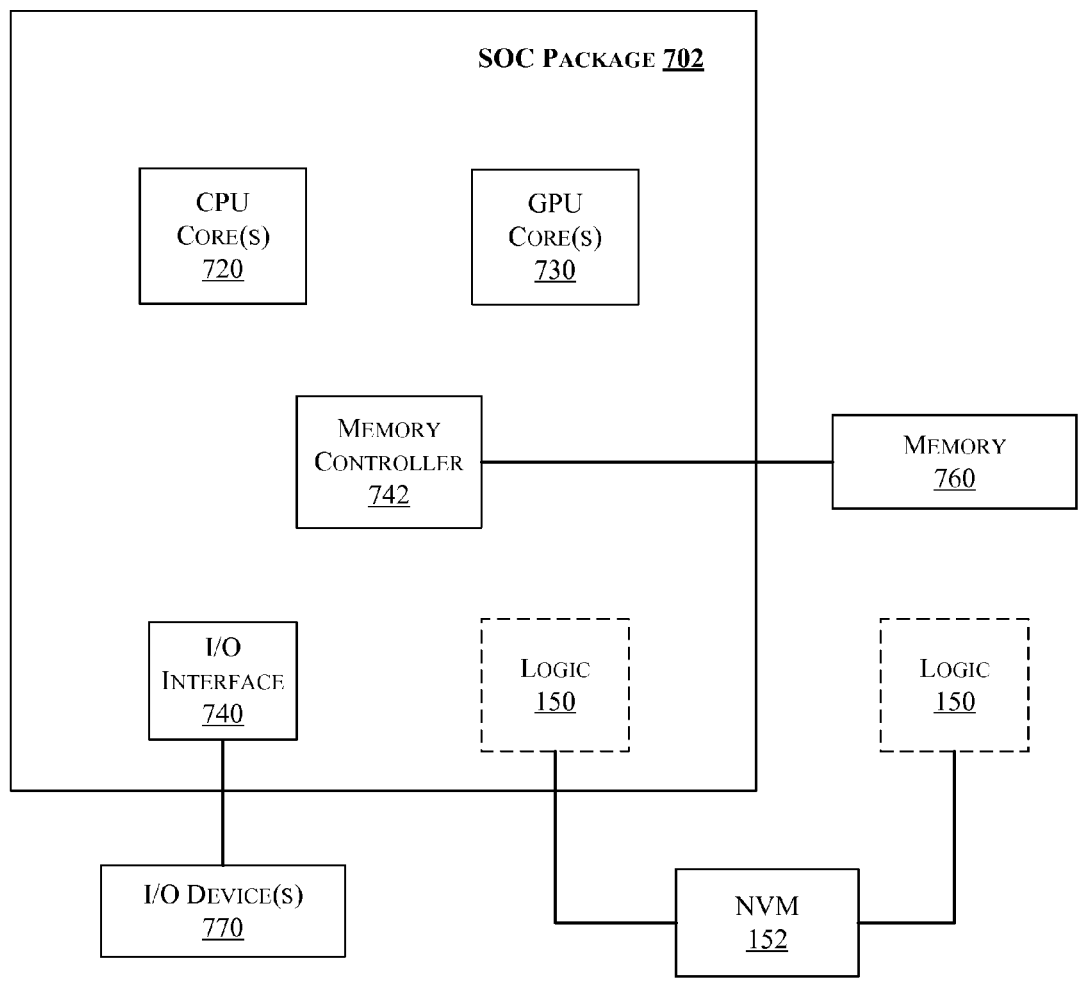

In some embodiments, one or more of the components discussed herein can be embodied on a System On Chip (SOC) device. FIG. 7 illustrates a block diagram of an SOC package in accordance with an embodiment. As illustrated in FIG. 7, SOC 702 includes one or more Central Processing Unit (CPU) cores 720, one or more Graphics Processor Unit (GPU) cores 730, an Input/Output (I/O) interface 740, and a memory controller 742. Various components of the SOC package 702 may be coupled to an interconnect or bus such as discussed herein with reference to the other figures. Also, the SOC package 702 may include more or less components, such as those discussed herein with reference to the other figures. Further, each component of the SOC package 720 may include one or more other components, e.g., as discussed with reference to the other figures herein. In one embodiment, SOC package 702 (and its components) is provided on one or more Integrated Circuit (IC) die, e.g., which are packaged onto a single semiconductor device.

As illustrated in FIG. 7, SOC package 702 is coupled to a memory 760 (which may be similar to or the same as memory discussed herein with reference to the other figures) via the memory controller 742. In an embodiment, the memory 760 (or a portion of it) can be integrated on the SOC package 702.

The I/O interface 740 may be coupled to one or more I/O devices 770, e.g., via an interconnect and/or bus such as discussed herein with reference to other figures. I/O device(s) 770 may include one or more of a keyboard, a mouse, a touchpad, a display, an image/video capture device (such as a camera or camcorder/video recorder), a touch screen, a speaker, or the like. Furthermore, SOC package 702 may include/integrate the logic 150 in an embodiment. Alternatively, the logic 150 may be provided outside of the SOC package 702 (i.e., as a discrete logic).

The following examples pertain to further embodiments. Example 1 includes an apparatus comprising: a storage device to store a boot version number corresponding to a portion of a non-volatile memory; and memory controller logic, coupled to the non-volatile memory, to cause an update of the stored boot version number in response to each subsequent boot event, wherein the memory controller logic is to return a zero in response to a read operation directed at the portion of the non-volatile memory and a mismatch between the stored boot version number and a current boot version number. Example 2 includes the apparatus of example 1, wherein the memory controller logic is to return the zero in response to the read operation directed at the portion of the non-volatile memory and the mismatch between the stored boot version number and the current boot version number without performing accessing the portion of the non-volatile memory. Example 3 includes the apparatus of example 1, wherein the memory controller logic is to cause the update of the boot version number in response to a write operation to the portion of the non-volatile memory. Example 4 includes the apparatus of example 1, wherein the current boot version number corresponds to an in-process boot event. Example 5 includes the apparatus of example 1, wherein the memory controller logic is to cause the update of the boot version number by incrementing the boot version number. Example 6 includes the apparatus of example 1, comprising refresh engine logic to continuously scrub each line of the non-volatile memory based on a reference address counter, wherein the reference address counter is to point to a line of the non-volatile memory to be scrubbed. Example 7 includes the apparatus of example 6, wherein the reference address counter is to be updated in response to scrubbing of a corresponding line of the non-volatile memory. Example 8 includes the apparatus of example 6, wherein the refresh engine logic is to perform a refresh cycle based on a pre-determined interval. Example 9 includes the apparatus of example 6, wherein the refresh engine logic is to perform a refresh cycle based on a refresh version number. Example 10 includes the apparatus of example 1, wherein the memory controller logic is to refrain from using the stored boot version number prior to a completion of a refresh cycle based on data stored in a current version refresh state table. Example 11 includes the apparatus of example 1, wherein the portion of the non-volatile memory is to store metadata, wherein the metadata is to comprise a saved version number and a zero bit per sub-portion of the portion of the non-volatile memory. Example 12 includes the apparatus of example 11, wherein the portion of the non-volatile memory is to comprise a memory line and the sub-portion is to comprise a sub-line. Example 13 includes the apparatus of example 12, wherein the memory line is to comprise four sub-lines. Example 14 includes the apparatus of example 1, wherein the non-volatile memory is to comprise three dimensional cross point memory. Example 15 includes the apparatus of example 14, wherein the non-volatile memory is to comprise a NAND flash memory or a NOR flash memory. Example 16 includes the apparatus of example 1, wherein the non-volatile memory is to comprise the storage device. Example 17 includes the apparatus of example 1, wherein one or more processor cores are coupled to the memory controller logic to access data stored in the non-volatile memory. Example 18 includes the apparatus of example 1, wherein one or more of the memory controller logic, one or more processor cores, the storage device, and the non-volatile memory are on a same integrated circuit die. Example 19 includes the apparatus of example 1, wherein the portion of the non-volatile memory is to comprise 256 bytes.

Example 20 includes a method comprising: storing, in a storage device, a boot version number corresponding to a portion of a non-volatile memory; and causing an update of the stored boot version number in response to each subsequent boot event, wherein a zero is returned in response to a read operation directed at the portion of the non-volatile memory and a mismatch between the stored boot version number and a current boot version number. Example 21 includes the method of example 20, wherein the zero is returned in response to the read operation directed at the portion of the non-volatile memory and the mismatch between the stored boot version number and the current boot version number without performing accessing the portion of the non-volatile memory. Example 22 includes the method of example 20, further comprising causing the update of the boot version number in response to a write operation to the portion of the non-volatile memory.

Example 23 includes a computer-readable medium comprising one or more instructions that when executed on a processor configure the processor to perform one or more operations to: store, in a storage device, a boot version number corresponding to a portion of a non-volatile memory; and cause an update of the stored boot version number in response to each subsequent boot event, wherein a zero is returned in response to a read operation directed at the portion of the non-volatile memory and a mismatch between the stored boot version number and a current boot version number. Example 24 includes the computer-readable medium of example 23, further comprising one or more instructions that when executed on the processor configure the processor to perform one or more operations to cause the zero to be returned in response to the read operation directed at the portion of the non-volatile memory and the mismatch between the stored boot version number and the current boot version number without performing accessing the portion of the non-volatile memory. Example 25 includes the computer-readable medium of example 23, further comprising one or more instructions that when executed on the processor configure the processor to perform one or more operations to cause the update of the boot version number in response to a write operation to the portion of the non-volatile memory.

Example 26 includes an system comprising: a processor; a storage device, coupled to the processor, to store a boot version number corresponding to a portion of a non-volatile memory; and memory controller logic, coupled to the non-volatile memory, to cause an update of the stored boot version number in response to each subsequent boot event, wherein the memory controller logic is to return a zero in response to a read operation directed at the portion of the non-volatile memory and a mismatch between the stored boot version number and a current boot version number. Example 27 includes the system of example 26, wherein the memory controller logic is to return the zero in response to the read operation directed at the portion of the non-volatile memory and the mismatch between the stored boot version number and the current boot version number without performing accessing the portion of the non-volatile memory. Example 28 includes the system of example 26, wherein the memory controller logic is to cause the update of the boot version number in response to a write operation to the portion of the non-volatile memory. Example 29 includes the system of example 26, wherein the current boot version number corresponds to an in-process boot event. Example 30 includes the system of example 26, wherein the memory controller logic is to cause the update of the boot version number by incrementing the boot version number. Example 31 includes the system of example 26, comprising refresh engine logic to continuously scrub each line of the non-volatile memory based on a reference address counter, wherein the reference address counter is to point to a line of the non-volatile memory to be scrubbed. Example 32 includes the system of example 31, wherein the reference address counter is to be updated in response to scrubbing of a corresponding line of the non-volatile memory. Example 33 includes the system of example 31, wherein the refresh engine logic is to perform a refresh cycle based on a pre-determined interval. Example 34 includes the system of example 31, wherein the refresh engine logic is to perform a refresh cycle based on a refresh version number. Example 35 includes the system of example 26, wherein the memory controller logic is to refrain from using the stored boot version number prior to a completion of a refresh cycle based on data stored in a current version refresh state table. Example 36 includes the system of example 26, wherein the portion of the non-volatile memory is to store metadata, wherein the metadata is to comprise a saved version number and a zero bit per sub-portion of the portion of the non-volatile memory. Example 37 includes the system of example 36, wherein the portion of the non-volatile memory is to comprise a memory line and the sub-portion is to comprise a sub-line. Example 38 includes the system of example 37, wherein the memory line is to comprise four sub-lines. Example 39 includes the system of example 26, wherein the non-volatile memory is to comprise flash memory. Example 40 includes the system of example 39, wherein the flash memory is to comprise a NAND flash memory or a NOR flash memory. Example 41 includes the system of example 26, wherein the non-volatile memory is to comprise the storage device. Example 42 includes the system of example 26, wherein one or more processor cores of the processor are coupled to the memory controller logic to access data stored in the non-volatile memory. Example 43 includes the system of example 26, wherein one or more of the memory controller logic, one or more processor cores of the processor, the storage device, and the non-volatile memory are on a same integrated circuit die. Example 44 includes the system of example 26, wherein the portion of the non-volatile memory is to comprise 256 bytes.

Example 45 includes an apparatus comprising means to perform a method as set forth in any preceding example.

46. Machine-readable storage including machine-readable instructions, when executed, to implement a method or realize an apparatus as set forth in any preceding claim.

In various embodiments, the operations discussed herein, e.g., with reference to FIGS. 1-7, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed with respect to FIGS. 1-7.

Additionally, such tangible computer-readable media may be downloaded as a computer program product, wherein the program may be transferred from a remote computer (e.g., a server) to a requesting computer (e.g., a client) by way of data signals (such as in a carrier wave or other propagation medium) via a communication link (e.g., a bus, a modem, or a network connection).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
   a storage device to store a boot version number corresponding to a portion of a non-volatile memory; and
   memory controller logic, coupled to the non-volatile memory, to cause an update of the stored boot version number in response to each subsequent boot event,
   wherein the memory controller logic is to return a zero in response to a read operation directed at the portion of the non-volatile memory and a mismatch between the stored boot version number and a current boot version number, wherein the portion of the non-volatile memory is to store metadata, wherein the metadata is to comprise a saved version number and a zero bit per sub-portion of the portion of the non-volatile memory.

2. The apparatus of claim 1, wherein the memory controller logic is to return the zero in response to the read operation directed at the portion of the non-volatile memory and the mismatch between the stored boot version number and the current boot version number without accessing the portion of the non-volatile memory.

3. The apparatus of claim 1, wherein the memory controller logic is to cause the update of the boot version number in response to a write operation to the portion of the non-volatile memory.

4. The apparatus of claim 1, wherein the current boot version number corresponds to an in-process boot event.

5. The apparatus of claim 1, wherein the memory controller logic is to cause the update of the boot version number by incrementing the boot version number.

6. The apparatus of claim 1, comprising refresh engine logic to continuously scrub each line of the non-volatile memory based on a reference address counter, wherein the reference address counter is to point to a line of the non-volatile memory to be scrubbed.

7. The apparatus of claim 6, wherein the reference address counter is to be updated in response to scrubbing of a corresponding line of the non-volatile memory.

8. The apparatus of claim 6, wherein the refresh engine logic is to perform a refresh cycle based on a pre-determined interval.

9. The apparatus of claim 6, wherein the refresh engine logic is to perform a refresh cycle based on a refresh version number.

10. The apparatus of claim 1, wherein the memory controller logic is to refrain from using the stored boot version number prior to a completion of a refresh cycle based on data stored in a current version refresh state table.

11. The apparatus of claim 1, wherein the portion of the non-volatile memory is to comprise a memory line and the sub-portion is to comprise a sub-line.

12. The apparatus of claim 1, wherein the memory line is to comprise four sub-lines.

13. The apparatus of claim 1, wherein the non-volatile memory is to comprise three dimensional cross point memory.

14. The apparatus of claim 1, wherein the non-volatile memory is to comprise the storage device.

15. The apparatus of claim 1, wherein one or more processor cores are coupled to the memory controller logic to access data stored in the non-volatile memory.

16. The apparatus of claim 1, wherein one or more of the memory controller logic, one or more processor cores, the storage device, and the non-volatile memory are on a same integrated circuit die.

17. The apparatus of claim 1, wherein the portion of the non-volatile memory is to comprise 256 bytes.

18. A method comprising:
   storing, in a storage device, a boot version number corresponding to a portion of a non-volatile memory; and
   causing an update of the stored boot version number in response to each subsequent boot event,
   wherein a zero is returned in response to a read operation directed at the portion of the non-volatile memory and a mismatch between the stored boot version number and a current boot version number, wherein the portion of the non-volatile memory stores metadata, wherein the metadata comprises a saved version number and a zero bit per sub-portion of the portion of the non-volatile memory.

19. The method of claim 18, wherein the zero is returned in response to the read operation directed at the portion of the non-volatile memory and the mismatch between the stored boot version number and the current boot version number without accessing the portion of the non-volatile memory.

20. The method of claim 18, further comprising causing the update of the boot version number in response to a write operation to the portion of the non-volatile memory.

21. A non-transitory computer-readable medium comprising one or more instructions that when executed on a processor configure the processor to perform one or more operations to:
   store, in a storage device, a boot version number corresponding to a portion of a non-volatile memory; and
   cause an update of the stored boot version number in response to each subsequent boot event,
   wherein a zero is returned in response to a read operation directed at the portion of the non-volatile memory and a mismatch between the stored boot version number and a current boot version number, wherein the portion of the non-volatile memory store metadata, wherein the metadata comprises a saved version number and a zero bit per sub-portion of the portion of the non-volatile memory.

22. The computer-readable medium of claim 21, further comprising one or more instructions that when executed on the processor configure the processor to perform one or more operations to cause the zero to be returned in response to the read operation directed at the portion of the non-volatile memory and the mismatch between the stored boot version number and the current boot version number without accessing the portion of the non-volatile memory.

23. The computer-readable medium of claim 21, further comprising one or more instructions that when executed on the processor configure the processor to perform one or more operations to cause the update of the boot version number in response to a write operation to the portion of the non-volatile memory.

* * * * *